(12) United States Patent
Ohkubo

(10) Patent No.: US 8,422,522 B2
(45) Date of Patent: Apr. 16, 2013

(54) SEMICONDUCTOR LASER DEVICE

(75) Inventor: Nobuhiro Ohkubo, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 298 days.

(21) Appl. No.: 12/485,680

(22) Filed: Jun. 16, 2009

(65) Prior Publication Data

US 2009/0310638 A1    Dec. 17, 2009

(30) Foreign Application Priority Data

Jun. 17, 2008    (JP) ................................. 2008-157782

(51) Int. Cl.
  *H01S 3/04*    (2006.01)
(52) U.S. Cl.
  USPC ............................................ 372/36; 257/670
(58) Field of Classification Search ................... 372/36; 257/670
  See application file for complete search history.

(56) References Cited

U.S. PATENT DOCUMENTS

| | | | |
|---|---|---|---|
| 5,309,460 A | 5/1994 | Fujimaki et al. | |
| 2003/0123499 A1* | 7/2003 | Ohgiyama et al. | 372/36 |
| 2005/0082646 A1 | 4/2005 | Komoto et al. | |
| 2005/0286581 A1* | 12/2005 | Shinohara et al. | 372/43.01 |
| 2006/0292720 A1 | 12/2006 | Nishikawa | |
| 2008/0056315 A1 | 3/2008 | Kurita | |

FOREIGN PATENT DOCUMENTS

| | | |
|---|---|---|
| CN | 1885646 | 12/2006 |
| CN | 101136536 | 3/2008 |
| JP | 5-23563 | 3/1993 |
| JP | 05-327118 | 12/1993 |
| JP | 7-326814 | 12/1995 |
| JP | 11-330626 | 11/1999 |
| JP | 2000-357839 | 12/2000 |
| JP | 2002-043672 | 2/2002 |
| JP | 2003-289167 | 10/2003 |
| JP | 2005-123326 | 5/2005 |
| JP | 2005-311147 | 11/2005 |
| JP | 2005-311401 | 11/2005 |
| JP | 2005-354099 | 12/2005 |
| JP | 2006-19332 | 1/2006 |
| JP | 2006-294657 | 10/2006 |
| JP | 2007-005505 | 1/2007 |
| JP | 2008-016715 | 1/2008 |
| JP | 2008-060301 | 3/2008 |

* cited by examiner

*Primary Examiner* — Tod T Van Roy

(74) *Attorney, Agent, or Firm* — Morrison & Foerster LLP

(57) ABSTRACT

In a semiconductor laser device, a first lead has a mounting portion for mounting a semiconductor laser element on its top surface via a submount member, and a lead portion extending from the mounting portion. Given that a direction in which a primary beam is emitted from the laser element is defined as a forward direction, and that a direction vertical to the forward direction and parallel to the top surface of the mounting portion is defined as a lateral direction, the first lead has, in one region of a side face of the mounting portion, a lateral reference surface which is parallel to a side face of the semiconductor laser element and flat. In the one region of the side face of the mounting portion, a recess portion is formed adjacent to the lateral reference surface.

9 Claims, 7 Drawing Sheets

SEMICONDUCTOR LASER DEVICE

TECHNICAL FIELD

The present invention relates to semiconductor laser devices and, in particular, to a semiconductor laser device to be used for optical information processing equipment such as optical disc devices.

BACKGROUND ART

In recent years, various types of semiconductor laser devices have been widely used as light sources for optical disc devices. In particular, high power semiconductor laser devices are used as write-use light sources for writing on discs of DVD (Digital Versatile Disc) players, DVD-RAM (Random Access Memory) drives, and the like, and there is a strong demand for higher power and further downsizing of semiconductor laser devices.

A frame type semiconductor laser device, which is one of conventional semiconductor laser devices, is described in JP 2005-311147 A (Patent Literature 1).

FIG. 7 shows a plan view of the frame type semiconductor laser device.

The frame type semiconductor laser device includes a metallic lead frame 102, a plurality of leads 103 to serve as electrodes, and a holding portion 107 for integrally holding the lead frame 102 and the plurality of leads 103.

The lead frame 102 has an element mounting portion 102a, a lead portion 102b and tie bar portions 102c. A semiconductor laser element 101 is mounted on the element mounting portion 102a via a submount member 108. Then, the semiconductor laser element 101 is electrically connected to the electrode leads 103 by wire.

A bottom surface of the element mounting portion 102a is exposed from the holding portion 107, while the tie bar portions 102c extend from the mounting portion 102a. Thus, during operation of the semiconductor laser element 101, the mounting portion 102a and the tie bar portions 102c work for heat radiation, making the heat radiation area enlarged, so that heat radiation characteristics of the semiconductor laser device can be improved.

However, the frame type semiconductor laser device has the following problem. When the semiconductor laser element 101 is enhanced for higher power, there arises a need for enlarging the heat radiation area of the semiconductor laser device for improvement of the heat radiation characteristics. This makes it difficult to downsize the semiconductor laser device.

Also in the frame type semiconductor laser device, when the semiconductor laser device is downsized, there is a problem that a power decline of the semiconductor laser element is inevitably involved to maintain its heat radiation characteristics.

SUMMARY OF INVENTION

Technical Problem

Accordingly, an object of the present invention is to provide a semiconductor laser device which can be downsized even with the semiconductor laser element enhanced for higher power and which can be prevented from power declines of the semiconductor laser element even with the downsizing fulfilled.

Solution to Problem

In order to achieve the above object, the present invention provides a semiconductor laser device comprising:

a semiconductor laser element;

a first lead having a mounting portion for mounting the semiconductor laser element on a top surface of the mounting portion via a submount member, and a lead portion extending from the mounting portion;

a second lead extending along the lead portion of the first lead; and a holding portion made of an insulative material for integrally holding the first lead and the second lead, wherein given that a direction in which a primary beam is emitted from the semiconductor laser element is defined as a forward direction, a direction vertical to the forward direction and parallel to the top surface of the mounting portion is defined as a lateral direction, and that a direction vertical to the top surface of the mounting portion is defined as an up/down direction, the first lead has, in one region of a side face of the mounting portion, a lateral reference surface which is parallel to a side face of the semiconductor laser element and which is flat, and in the one region of the side face of the mounting portion, a recess portion is provided adjacent to the lateral reference surface.

According to the semiconductor laser device of this invention, the lateral reference surface is adjacent to one side of the recess portion. On the other hand, there may be provided, adjacent to the other side portion of the recess portion, a part of a connecting portion with a frame, for example, and in which case the first lead is obtained by cutting the connecting portion. In this case, since the recess portion is present between the part of the connecting portion and the lateral reference surface, damage of the lateral reference surface can be prevented even if the connecting portion is cut.

Therefore, because the flatness of the surface of the mounting portion 1a is kept from deterioration, which would be caused by damage of the lateral reference surface, a large contact area between the surface of the mounting portion and the submount member is ensured. Therefore heat of the semiconductor laser element can be radiated or dissipated efficiently via the submount member to the mounting portion 1a. That is, the heat radiation property of the semiconductor laser element can be improved.

As a result, the semiconductor laser device can be downsized even with the semiconductor laser element enhanced for higher power, and moreover power declines of the semiconductor laser element can be prevented even with the downsizing fulfilled.

In one embodiment, the first lead has a tie bar portion connected to and protruded laterally from the mounting portion, and a bottom surface of the tie bar portion and a bottom surface of the mounting portion are coplanar with each other.

If the semiconductor laser device is mounted on, for example, an optical pickup device in such a manner that the bottom surface of the tie bar portion is in contact with a housing of the optical pickup device, the tie bar portion works for heat radiation during the operation of the semiconductor laser element. Thus, even if the semiconductor laser device is downsized, a good heat radiation property can be obtained.

Also, since the bottom surface of the tie bar portion and the bottom surface of the mounting portion are coplanar with each other, both the bottom surface of the tie bar portion and the bottom surface of the mounting portion may be placed in contact with one surface of the housing of the optical pickup device, so that the heat radiation property can be improved.

In one embodiment, the recess portion is interposed between the lateral reference surface and the tie bar portion.

According to the semiconductor laser device of this embodiment, in the case where the tie bar portion is part of the connecting portion with the frame as an example and where the tie bar portion is formed by cutting the connecting portion, since the recess portion is present between the tie bar portion and the lateral reference surface, the lateral reference surface is prevented from being damaged even if the connecting portion is cut.

In one embodiment, an outer side face of the tie bar portion is coplanar with or is located laterally inside of the lateral reference surface.

According to the semiconductor laser device of this embodiment, because the outer side face of the tie bar portion is coplanar with or is located laterally inside of the lateral reference surface, it becomes easily achievable to identify the lateral reference surface when the lateral reference surface is viewed from frontward.

In one embodiment, the tie bar portion is positioned rearward of the semiconductor laser element.

According to the semiconductor laser device of this embodiment, even if the tie bar portion is formed by cutting the part containing the tie bar portion, due to the tie bar portion being positioned rearward of the semiconductor laser element, stress that would be generated, during the cutting of the part, in part of the mounting portion near the semiconductor laser element is reduced. Thus, the flatness of the mounting portion in an area near the semiconductor laser element is ensured.

In one embodiment, a bottom surface of the mounting portion is exposed from the holding portion and has an up/down reference surface which is parallel to the bottom surface of the semiconductor laser element and which is flat. And given that a direction running from the semiconductor laser element toward the mounting portion is defined as a downward direction, a lower surface of the holding portion and the up/down reference surface are coplanar with each other.

In the stage of mounting the semiconductor laser device of this embodiment on an optical pickup device as an example, when the lower surface of the holding portion is brought into contact with the housing of the optical pickup device, the bottom surface of the mounting portion, which is the up/down reference surface, can also be brought into contact with the housing because the lower surface of the holding portion and the up/down reference surface are coplanar with each other.

Therefore, the lower surface of the holding portion and the bottom surface of the mounting portion work for heat radiation during the operation of the semiconductor laser element, so that a good heat radiation property can be obtained even with the downsizing fulfilled.

That is, since heat generated by the semiconductor laser element is radiated to the housing through the mounting portion and the holding portion, a large heat radiation area is obtained even with the downsizing fulfilled, so that the heat radiation property is good.

In one embodiment, a lower surface of the semiconductor laser device consists of the lower surface of the holding portion and the up/down reference surface of the first lead, and the lower surface of the holding portion is positioned rearward of the up/down reference surface.

In the stage of mounting the semiconductor laser device on, for example, an optical pickup device, the lower surface of the semiconductor laser device may be brought into contact with the housing of the optical pickup device. In this case, because the lower surface of the semiconductor laser element consists of only the lower surface of the holding portion and the up/down reference surface of the first lead, a structure for bringing the up/down reference surface into contact with the housing is prevented from being complicated.

Also, in the case where the holding portion is lower in thermal conductivity than the first lead, since the lower surface of the holding portion is positioned rearward of the up/down reference surface, the lower surface of the holding portion in which heat is to be accumulated is kept separate from the semiconductor laser element.

In one embodiment, the top surface of the mounting portion of the first lead, a bottom surface of the lead portion of the first lead, and a bottom surface of the second lead are coplanar with one another.

According to the semiconductor laser device of this embodiment, since the top surface of the mounting portion of the first lead, the bottom surface of the lead portion of the first lead, and the bottom surface of the second lead are coplanar with one another, the processing of the first lead and the second lead does not require any complicated process. Therefore, their processing variations can be suppressed.

In one embodiment, the mounting portion of the first lead, the lead portion of the first lead, and the second lead are equal in up/down direction thickness to one another.

According to the semiconductor laser device of this embodiment, since the mounting portion of the first lead, the lead portion of the first lead, and the second lead have the same up/down direction thickness, the mounting portion of the first lead, the first lead and the second lead can be formed from one sheet of plate material.

Therefore, the machining for forming the first lead and the second lead never becomes any complicated one, so that their machining variations can be suppressed.

In one embodiment, the holding portion has a frame portion around the semiconductor laser element, and a window portion for emitting a primary beam from the semiconductor laser element is formed in the frame portion. Also, given that an inside of the frame portion of the holding portion is defined as a side on which the semiconductor laser element is mounted on the mounting portion via the submount member, a tapered portion having a surface inclined with respect to the top surface of the mounting portion is provided in a location in the inside of the frame portion of the holding portion.

According to the semiconductor laser device of this embodiment, since the tapered portion having a surface inclined with respect to the top surface of the mounting portion is formed inside of the frame portion of the holding portion, connection of wires to the surfaces of the first and second leads positioned inside of the frame portion of the holding portion is facilitated even with the downsizing of the semiconductor laser device implemented.

In one embodiment, the tapered portion is located rearward of the semiconductor laser element.

According to the semiconductor laser device of this embodiment, since the tapered portion is located rearward of the semiconductor laser element, cracking and chipping of the semiconductor laser element, which might occur due to contact with the semiconductor laser element during the connection of wire to the surface of the second lead positioned inside of the frame portion of the holding portion, can be reduced even with the downsizing of the semiconductor laser device implemented.

In one embodiment, an upper surface of the submount member and a top surface of the second lead positioned inside of the frame portion of the holding portion are connected to each other with a wire.

According to the semiconductor laser device of this embodiment, by connecting the upper surface of the submount member and the surface of the second lead positioned inside of the frame portion of the holding portion to each other with a wire, the second lead is electrically connected to the semiconductor laser element.

In one embodiment, the mounting portion has a part of a protrusive shape at its rear side.

According to the semiconductor laser device of this embodiment, since the part of the mounting portion at its rear side has a protrusive shape, this part and the upper surface of the semiconductor laser element can be easily connected to each other by wire even with the downsizing of the semiconductor laser device implemented.

In one embodiment, an upper surface of the semiconductor laser element and the part having the protrusive shape are connected to each other with a wire.

According to the semiconductor laser device of this embodiment, the upper surface of the semiconductor laser element and the part having the protrusive shape are connected to each other with a wire. Thus, the first lead is electrically connected to the semiconductor laser element.

In one embodiment, the first lead and the second lead extend through and beyond the holding portion, a portion of the first lead extending through the holding portion has an up/down bent portion that is bent in an up/down direction, and a portion of the second lead extending through the holding portion has a left/right bent portion that is bent in a left/right direction.

According to the semiconductor laser device of this embodiment, since the portion of the first lead extending through the holding portion has an up/down bent portion, an anti-disengaging effect of the first lead against the holding portion can be obtained.

Also, since the portion of the second lead extending through the holding portion has a left/right bent portion, an anti-disengaging effect of the second lead against the holding portion can be obtained.

That is, in the stage that the semiconductor laser device is mounted on an optical pickup device as an example, even if the material of the holding portion is softened by heat of the solder in the soldering of the first lead and the second lead, the first lead and the second lead can be prevented from moving relative to the holding portion by virtue of the up/down bent portion of the first lead as well as the left/right bent portion of the second lead.

Thus, in soldering of the first lead and the second lead, stable soldering can be achieved, leading to a high productivity.

In one embodiment, a cut-and-raised portion is formed by cutting and upwardly raising a region of the mounting portion other than a region where the semiconductor laser element is mounted, and spaces formed in the mounting portion by the formation of the cut-and-raised portion are filled with the material of the holding portion.

According to the semiconductor laser device of this embodiment, since spaces formed in the mounting portion due to the formation of the cut-and-raised portion are filled with the material of the holding portion, a larger contact area between the mounting portion and the holding portion can be obtained so that the mounting portion can be prevented from peeling from the holding portion.

In addition, if spaces formed in the mounting portion due to the formation of the cut-and-raised portion are just filled with a material of the holding portion, then the lower surface of the semiconductor laser device can be made flat. In such a case, in the stage that the semiconductor laser device is mounted on an optical pickup device as an example, the bottom surface of the mounting portion of the first lead and the like can be brought into close contact with the housing of the optical pickup device. Thus, heat radiation characteristics of the semiconductor device can be prevented from deteriorating.

In one embodiment, the mounting portion is formed with a protruding portion that protrudes forward of the mounting portion, and a front face of the protruding portion is positioned forward of the semiconductor laser element and serves as a front/back reference for positioning the semiconductor laser element in a front/back direction.

In the stage of mounting the semiconductor laser device of this embodiment on an optical pickup device as an example, even if the front face of the protruding portion of the mounting portion is brought into contact with the housing of the optical pickup device, the semiconductor element can be prevented from being damaged because the front face of the protruding portion is positioned forward of the semiconductor laser element.

Also, only by putting the front face of the protruding portion of the mounting portion into contact with the housing of the optical pickup device, positioning of a light-emitting point of the semiconductor laser element in the front/back direction can be easily achieved.

In one embodiment, each of the leads is formed by plating a core material with a metal which is better in solderability than the core material.

According to the semiconductor laser device of this embodiment, one surface (plated surface) of each lead having better solderability in comparison to the exposed surface (end face) of the core material becomes relatively wide.

Therefore, in soldering of the leads in the stage that the semiconductor laser device is mounted on an optical pickup device, an improved solderability is achieved, so that the productivity is improved.

In one embodiment, the core material is made of Cu, and a topmost surface of the plating metal is made of Au.

According to the semiconductor laser device of this embodiment, the topmost surface of the plating metal, which is made of Au, is better in solderability than the core material, which is made of Cu.

Therefore, in soldering the leads in the stage that the semiconductor laser device is mounted on an optical pickup device as an example, good solderability is improved.

In one embodiment, the material of the holding portion is a resin.

According to the semiconductor laser device of this embodiment, since the material of the holding portion is a resin, the holding portion can be easily formed by resin molding with a metal mold.

In one embodiment, the holding portion is black colored.

According to the semiconductor laser device of this embodiment, the holding portion is black colored. Therefore, in the operation of the semiconductor laser element, even if return light from a laser beam application object (e.g., information recording medium) has been incident on the holding portion, the return light is absorbed to the holding portion so as not to be reflected.

As a result, in a device using the semiconductor laser device (e.g., optical pickup devices), return light from the laser beam application object is prevented from causing a noise.

In one embodiment, the semiconductor laser element is structured so as to be enabled to emit a plurality of laser beams which are different or identical in emission wavelength.

According to the semiconductor laser device of this embodiment, for example, when a red/infrared monolithic 2-wavelength, 1-chip semiconductor laser element is used as the semiconductor laser element, parts count of the optical pickup device is cut down while the optical pickup device becomes easy to downsize.

Advantageous Effects of Invention

According to the semiconductor laser device of the invention, in one region of a side face of the mounting portion of the first lead, a recess portion is formed so as to be adjacent to the lateral reference surface. Therefore, even if a one-side portion of the recess portion opposite to the lateral reference surface side is formed by cutting, the lateral reference surface can be prevented from being damaged.

Thus, while the flatness of the surface of the mounting portion is kept from being deteriorated due to any damage of the lateral reference surface, a large contact area between the surface of the mounting portion and the submount member can be obtained, so that heat of the semiconductor laser element can be radiated efficiently via the submount member to the mounting portion.

As a result, the semiconductor laser device can be downsized even with the semiconductor laser element enhanced for higher power. Moreover, power declines of the semiconductor laser element can be prevented even with the downsizing fulfilled.

BRIEF DESCRIPTION OF DRAWINGS

The present invention will become more fully understood from the detailed description given hereinbelow and the accompanying drawings which are given by way of illustration only, and thus are not intended to limit the present invention, and wherein.

DESCRIPTION OF EMBODIMENTS

Hereinbelow, embodiments of the present invention will be described in detail with reference to the accompanying drawings.

Figure 1:
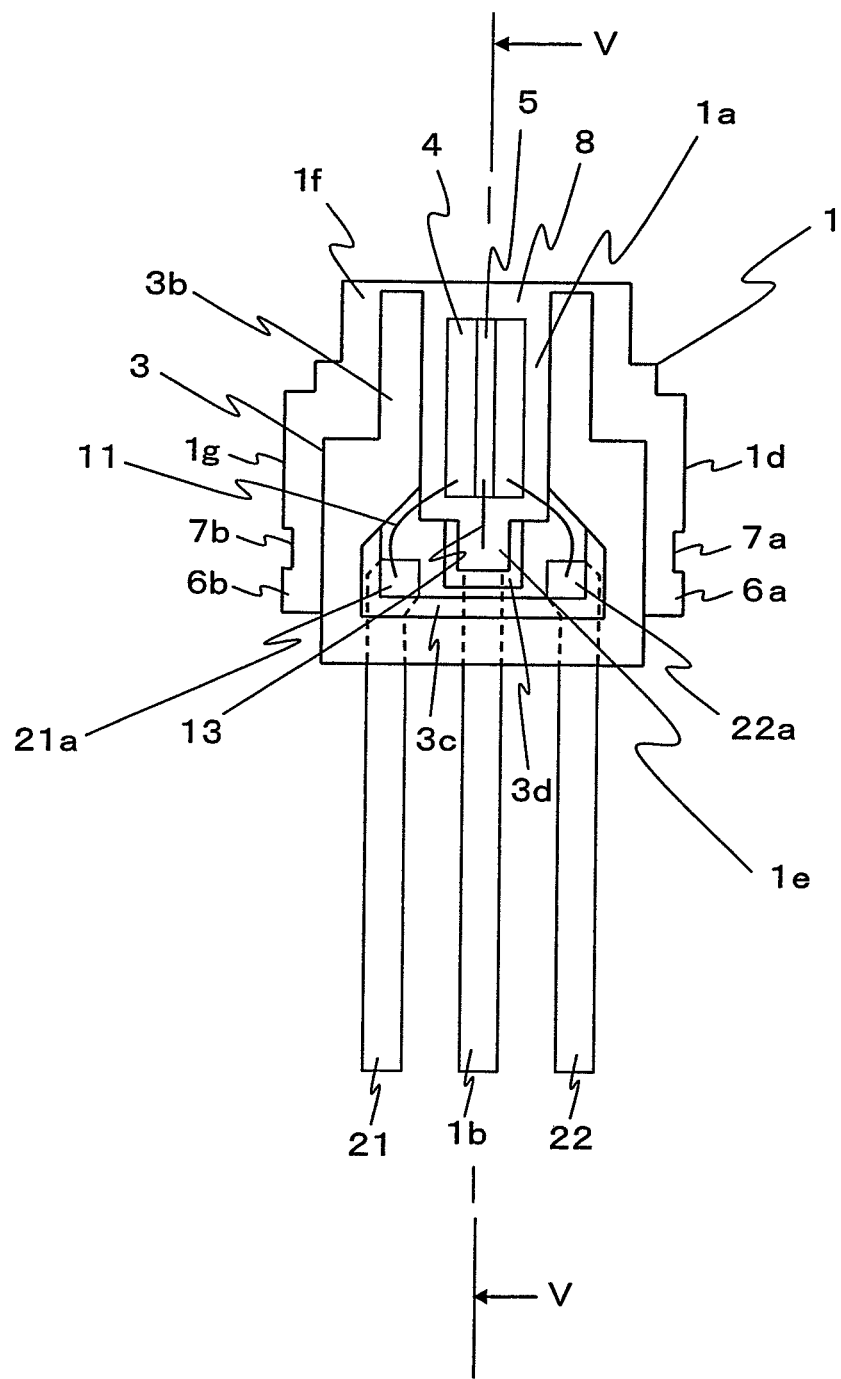
FIG. 1 is a schematic plan view of a semiconductor laser device according to an embodiment of the invention.
Figure 2:
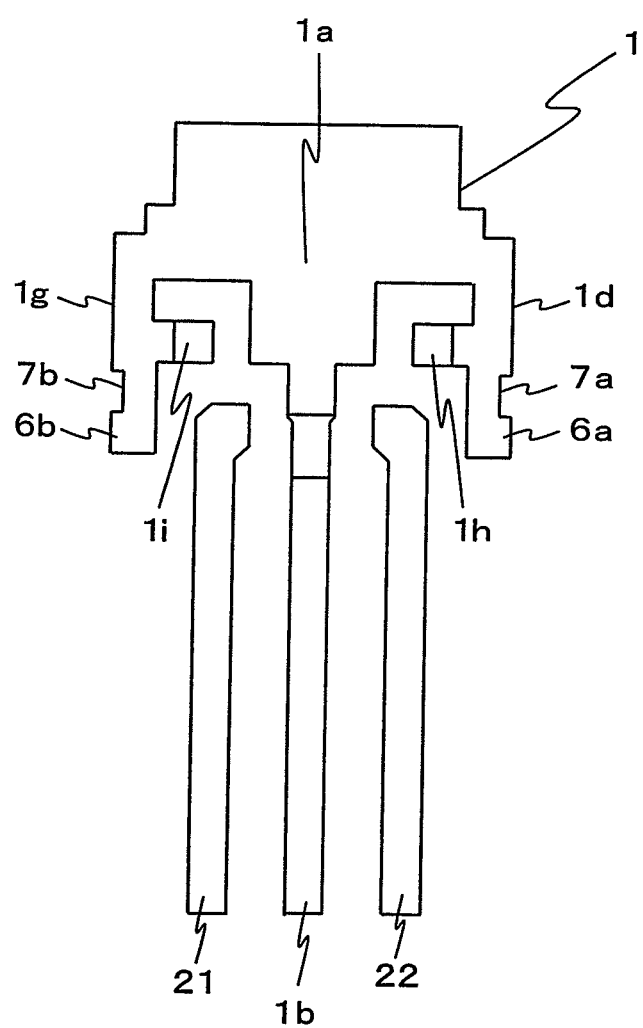
FIG. 2 is a schematic plan view of first and second leads of the semiconductor laser device.

FIG. 1 is a schematic view of a frame type semiconductor laser device according to an embodiment of the invention, as viewed from above. FIG. 2 is a view in which members other than a first lead 1 and second leads 21, 22 have been removed from FIG. 1. In FIG. 2, cut-and-raised portions 1h, 1i of the first lead 1 are shown in their unbent state (before being pulled up frontward of the drawing sheet).

The frame type semiconductor laser device, as shown in FIG. 1, includes a first lead 1 having a mounting portion 1a for mounting a semiconductor laser element 5 thereon, a plurality of second leads 21, 22 for use of signal input and output, and a resin portion 3 for integrally holding the first lead 1 and the second leads 21, 22. The resin portion 3 is an example of the holding portion.

More specifically, given that a direction in which a primary beam is emitted from the semiconductor laser element 5 (i.e., an upward direction in FIG. 1) is defined as a forward direction while a direction vertical to the forward direction and parallel to a surface of the mounting portion 1a (i.e., a leftward-and-rightward direction in FIG. 1) is defined as a lateral direction, the first lead 1, as shown in FIG. 2, has a plate-like mounting portion 1a, an elongate lead portion 1b extending from the mounting portion 1a, tie bar portions 6a, 6b connected to and protruded leftward and rightward in FIG. 1 from the mounting portion 1a, and recess portions 7a, 7b formed in side faces 1d, 1g of the mounting portion 1a.

On the surface of the mounting portion 1a, as shown in FIG. 1, the semiconductor laser element 5 is mounted via a rectangular plate-like submount member 4. The semiconductor laser element 5 has a rectangular-parallelopiped shape elongate in an optical axis direction, and emits a laser beam frontward (upward in FIG. 1).

Figure 3:
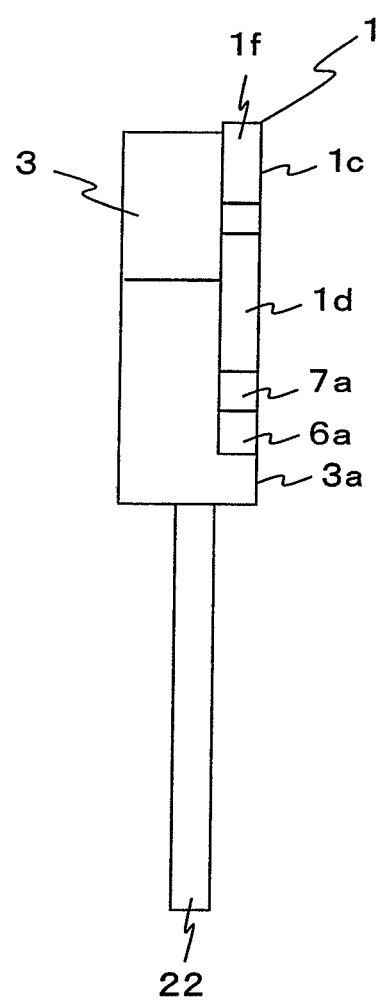
FIG. 3 is a schematic side view of the semiconductor laser device.
Figure 4:
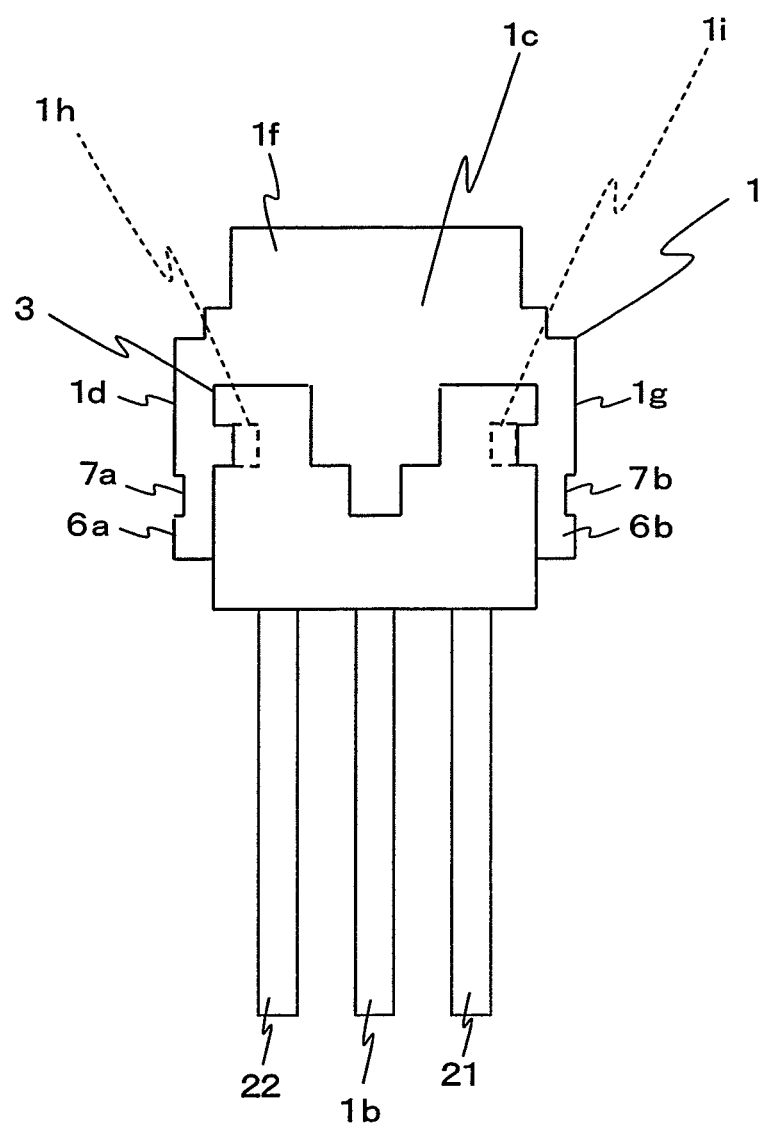
FIG. 4 is a schematic bottom view of the semiconductor laser device.

FIG. 3 is a schematic view of the semiconductor laser device as viewed sideways. FIG. 4 is a schematic view of the semiconductor laser device as viewed from below.

The tie bar portions 6a, 6b, as shown in FIGS. 3 and 4, each have a bottom surface smoothly connecting to a bottom surface 1c of the mounting portion 1a. That is, the bottom surfaces of the tie bar portions 6a, 6b adjoin the bottom surface 1c of the mounting portion 1a and the bottom surfaces of the tie bar portions 6a, 6b are flush, or coplanar, with the bottom surface 1c of the mounting portion 1a.

When a direction vertical to the top surface of the mounting portion 1a (i.e., a direction vertical to the drawing sheet of FIG. 1) is defined as an up/down direction, the bottom surface 1c of the mounting portion 1a of the first lead 1 is exposed from the resin portion 3 and this bottom surface 1c serves as an up/down reference surface for the semiconductor laser element 5. That is, positioning of the semiconductor laser element 5 in the up/down direction is done by referencing the bottom surface 1c. Also, the up/down reference surface is a plane parallel to the bottom surface of the semiconductor laser element 5 and is a flat surface.

One region of the side face 1d, 1g of the mounting portion 1a is set as a lateral reference surface for the semiconductor laser element 5. That is, positioning of the semiconductor laser element 5 in the lateral direction is done by referencing the one region of the side face 1d. Also, the lateral reference surface is a plane parallel to the side face of the semiconductor laser element 5 and is a flat surface.

The first lead 1 has a protrusive portion 1f connected to and positioned frontward of the mounting portion 1a in adjacency to the mounting portion 1a. The front surface of the protrusive portion 1f is positioned more frontward than the resin portion 3 and the semiconductor laser element 5. The front surface of the protrusive portion 1f is set as a front-back reference for the semiconductor laser element 5. That is, positioning of the semiconductor laser element 5 in the front-back direction is done by referencing the front surface of the protrusive portion 1f. The protrusive portion 1f is an example of the protruding portion.

Further, when a direction from the semiconductor laser element 5 toward the bottom surface 1c of the mounting portion 1a of the first lead 1 is defined as a downward direction, a lower surface 3a of the resin portion 3 is coplanar with the bottom surface 1c of the mounting portion 1a, which is the up/down reference surface. A plain containing the lower surface 3a of the resin portion 3 and the bottom surface 1c of the mounting portion 1a contains only these surfaces. That is, the lower surface of the semiconductor laser device is constituted by only the lower surface 3a of the resin portion 3 and the up/down reference surface of the first lead 1. Part of the lower surface 3a of the resin portion 3 is positioned rearward of the semiconductor laser element 5.

The tie bar portions 6a, 6b are protruded out in the leftward and rightward directions, but not protruded from the lateral reference surfaces for the semiconductor laser element 5. In more detail, a side face of the tie bar portion 6a, 6b and the lateral reference surface for the semiconductor laser element 5 are contained in one plane.

The recess portions 7a, 7b formed in the side faces of the mounting portion 1a of the first lead 1 are formed so as to be adjacent to the corresponding lateral reference surfaces for the semiconductor laser element 5, i.e., adjacent to one region of each side face 1d, 1g of the mounting portion 1a of the first lead 1.

Also, the recess portions 7a, 7b formed in the side faces 1d, 1g of the mounting portion 1a are located between the corresponding lateral reference surfaces for the semiconductor laser element 5 (i.e., one region of the side faces 1d, 1g of the mounting portion 1a of the first lead 1) and the corresponding tie bar portions 6a, 6b.

The recess portions 7a, 7b are positioned rearward of the semiconductor laser element 5. The recess portion 7a is positioned rightward of the semiconductor laser element 5, while the recess portion 7b is positioned leftward of the semiconductor laser element 5.

The top surface of the mounting portion 1a, the bottom surface of the lead portion 1b, and the bottom surfaces of the second leads 21, 22 are coplanar with one another in the up/down direction. Also, the mounting portion 1a, the lead portion 1b, and the second leads 21, 22 are equal in thickness to one another in the up/down direction. In this embodiment, the mounting portion 1a, the lead portion 1b and the second leads 21, 22 are all set to an up/down direction thickness of 0.4 mm.

The resin portion 3 has a frame portion 3b formed on the top surface side of the mounting portion 1a. The frame portion 3b faces both side faces and a rear face of the semiconductor laser element 5. A window portion 8 is formed in the frame portion 3b so that the primary beam emitted from the semiconductor laser element 5 passes through the window portion 8.

Figure 5:
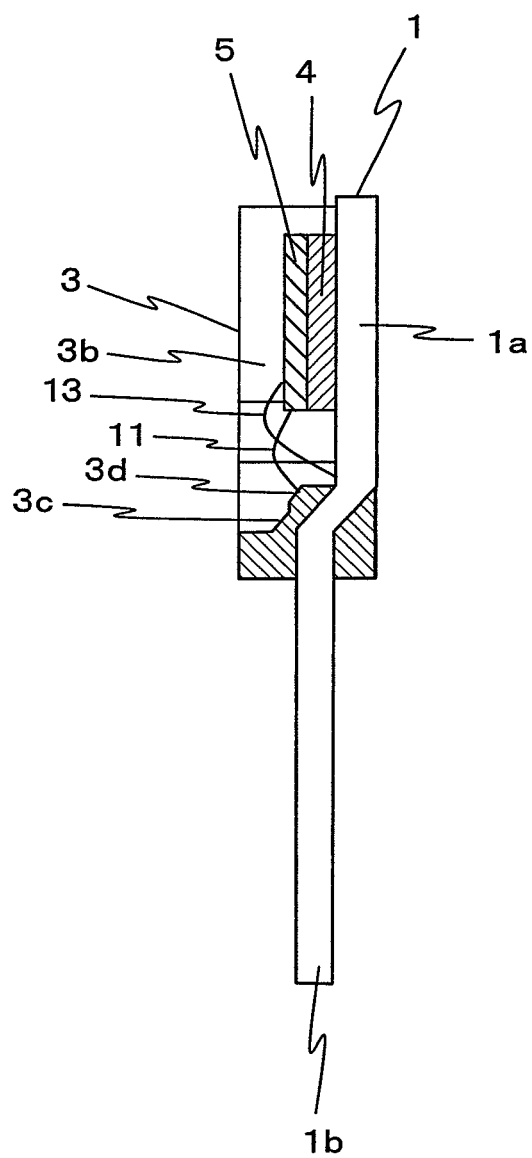
FIG. 5 is a schematic sectional view taken along the line V-V of FIG. 1.

FIG. 5 is a schematic sectional view taken along the line V-V of FIG. 1.

When the inside of the frame portion 3b of the resin portion 3 is defined as a location in which the semiconductor laser element 5 is mounted via the submount member 4, up/down pointed tapered portions 3c, 3d are formed in the inside of the frame portion 3b of the resin portion 3 as shown in FIGS. 1 and 5. These tapered portions 3c, 3d are positioned rearward of the semiconductor laser element 5.

Further as shown in FIGS. 1 and 2, the elongate second leads 21, 22 extend along the lead portion 1b of the first lead 1. Also, inner end portions (forward end portions) 21a, 22a of the second leads 21, 22 are exposed without being covered with the resin portion 3. Also, wires 11, 12 made of Au wire are routed from the upper surface of the submount member 4 to the inner end portions 21a, 22a of the second leads 21, 22.

A protrusive portion 1e is included in one region rearward of the mounting portion 1a of the first lead. This protrusive portion 1e is positioned between one side portion of the resin portion 3 and another side portion of the resin portion 3 and forward of the rear portion of the resin portion 3. Further, a wire 13 made of Au wire is routed from the upper surface of the semiconductor laser element 5 to the protrusive portion 1e.

The lead portion 1b of the first lead 1 and the second leads 21, 22 run through and beyond the resin portion 3. A portion extending through the resin portion 3 of the lead portion 1b includes an up/down bent portion which is bent in the up/down direction. Also, each of portions extending through the resin portion 3 of the second leads 21, 22 includes a left/right bent portion which is bent in the left/right direction.

As shown in FIGS. 1 and 4, cut-and-raised portions 1h, 1i of the first lead 1 are provided at positions leftward and rightward of the semiconductor laser element 5, respectively. These cut-and-raised portions 1h, 1i are formed by cutting and upwardly raising regions of the mounting portion 1a other than a region on which the semiconductor laser element 5 is mounted. That is, the cut-and-raised portions 1h, 1i extend upward from the top surface of the mounting portion 1a. Also, spaces formed in the mounting portion 1a due to the formation of the cut-and-raised portions 1h, 1i are filled with the material of the resin portion 3.

The lead portion 1b of the first lead 1 and the second leads 21, 22 have their core material plated with a metal which is better in solderability than the core material. In this embodiment, the core material is made of Cu, and the topmost surface of the plated metal is made of Au.

The resin portion 3 in this embodiment is made of a black-colored insulative resin material, such as epoxy resin. Accordingly, the resin portion 3 is easily formed by resin molding with a metal mold.

The semiconductor laser element 5 may be so structured as to be enabled to emit a plurality of laser beams which are different or identical in emission wavelength. In this embodiment, the semiconductor laser element 5 may be a monolithic 2-wavelength, 1-chip high-power semiconductor laser element in which a 660 nm-band red high-power semiconductor laser element and a 780 nm-band infrared high-power semiconductor laser element are integrated.

As described above, in the semiconductor laser device of this embodiment, the recess portions 7a, 7b are each formed between the corresponding lateral reference surface (one region of the side face 1d, 1g of the mounting portion 1a of the first lead 1) for the semiconductor laser element 5 and the corresponding tie bar portion 6a, 6b. These tie bar portions 6a, 6b are part of tie bars 52 that initially connect a frame 50 and the first lead 1 shown in FIG. 6 to each other.

Figure 6:
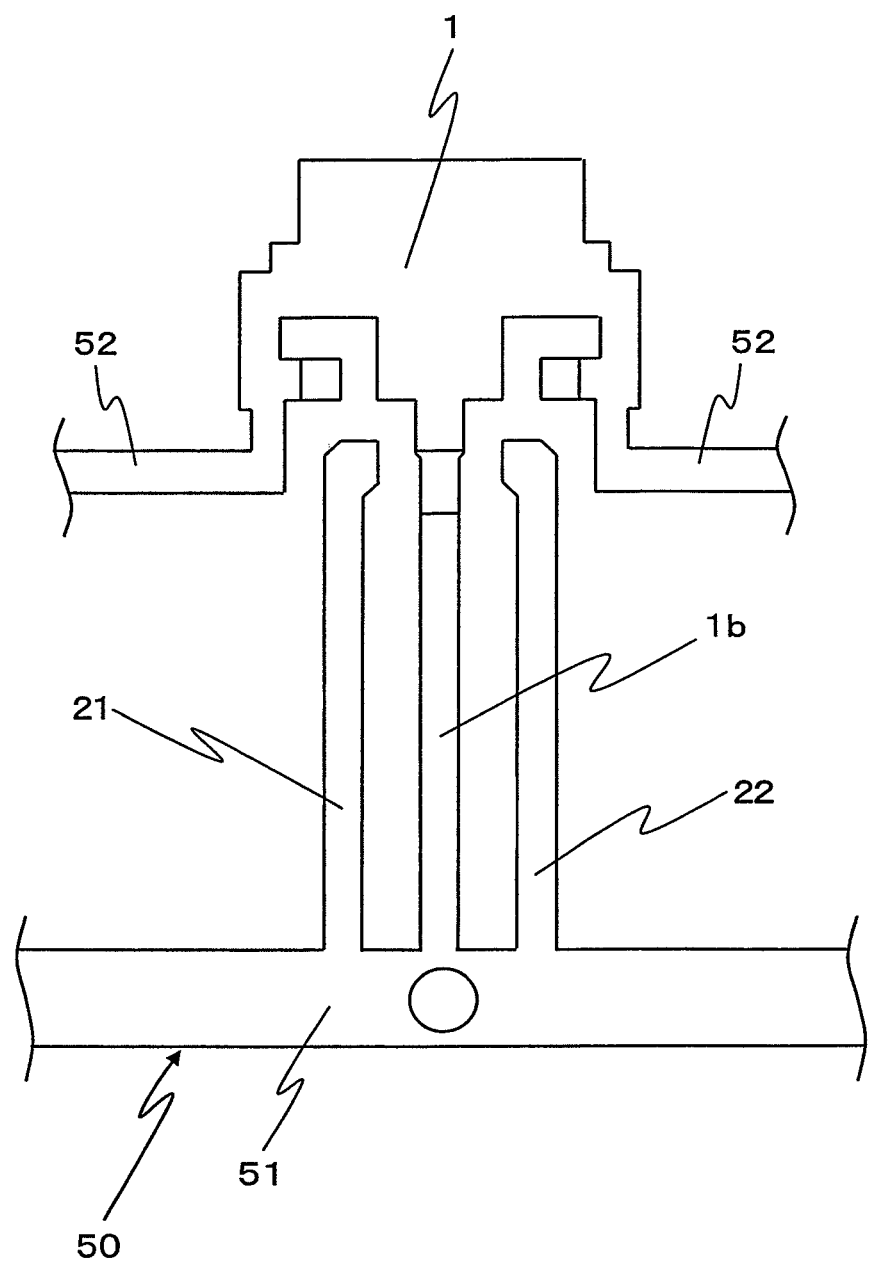
FIG. 6 is a process view of the semiconductor laser device.
Figure 7:
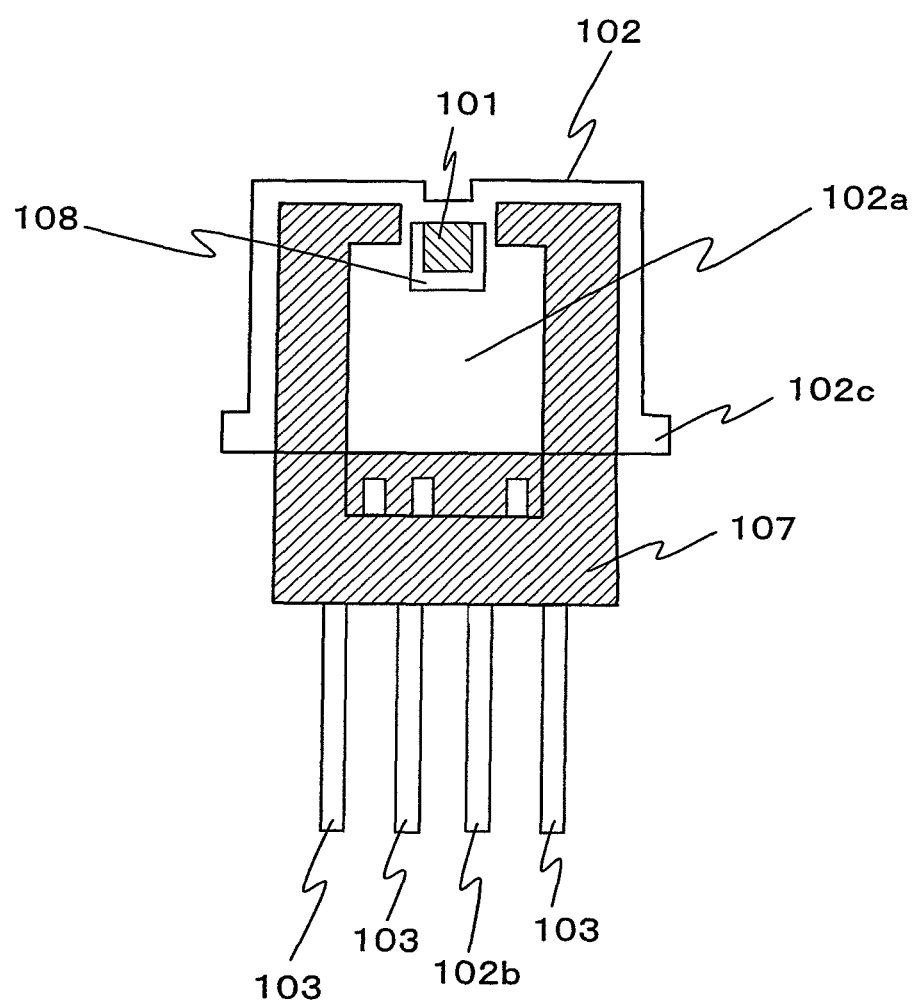
FIG. 7 is a schematic plan view of a semiconductor laser device according to prior art.

Therefore, during the manufacture of the semiconductor laser device, even when the tie bar portions 6a, 6b are formed by cutting the tie bars 52 that connect the frame 50 and the first lead 1 to each other so that the first lead 1 is separated from the frame 50 shown in FIG. 6, the lateral reference surfaces for the semiconductor laser element 5 are prevented from being damaged.

Thus, because the flatness of the surface of the mounting portion 1a is kept from deterioration, which would be caused by damage of the lateral reference surface, a large contact area between the surface of the mounting portion 1a and the submount member 4 is ensured. Therefore heat of the semiconductor laser element 5 can be radiated or dissipated efficiently via the submount member 4 to the mounting portion 1a. That is, the heat radiation property of the semiconductor laser element 5 can be improved.

As a result, the semiconductor laser device can be downsized even with the semiconductor laser element 5 enhanced for higher power, and moreover power declines of the semiconductor laser element 5 can be prevented even with the downsizing fulfilled.

Since the tie bar portions 6a, 6b are located rearward of the semiconductor laser element 5, part of the mounting portion 1a near the semiconductor laser element 5 is less likely subject to stress generated in the cutting of the tie bar 52, so that the flatness of the part of the mounting portion 1a near the semiconductor laser element 5 can be ensured. Thus, the contact area of the submount member 4 with the mounting portion 1a is not narrowed.

Consequently, heat generated by the semiconductor laser element 5 is more easily radiated by the first lead 1 via the submount member 4.

Further, the semiconductor laser element 5 is mounted on the mounting portion 1a of the first lead 1, and the bottom surface 1c of the mounting portion 1a of the first lead 1 is exposed from the resin portion 3. Moreover, the bottom surface 1c serves as the up/down reference surface for the semiconductor laser element 5, while the lower surface 3a of the resin portion 3 is coplanar with the up/down reference surface.

As a result, if the semiconductor laser device is mounted on, for example, an optical pickup device in such a manner that the bottom surface 1c of the mounting portion 1a of the first lead 1 and the lower surface 3a of the resin portion 3 is in contact with a housing of the optical pickup device, these surfaces work for heat radiation during the operation of the semiconductor laser element 5. That is, heat generated by the semiconductor laser element 5 is radiated to the housing through the bottom surface 1c of the mounting portion 1a of the first lead 1 and the lower surface 3a of the resin portion 3.

Thus, even if the semiconductor laser device is downsized, a wide heat radiation area is obtained, so that the heat radiation property is improved.

Now, a manufacturing method for the semiconductor laser device will be explained.

i) First, a plate material made of Cu is punched out, by which the frame 50 shown in FIG. 6 is obtained (punching step). In this operation, the punching is performed from the bottom surface 1c side of the mounting portion 1a of the first lead 1. As a result, burrs caused by the punching appear on the mounting portion 1a side. Therefore, when the semiconductor laser device is mounted on an other device such as an optical pickup, the bottom surface 1c can be set into close contact with the mounting surface of the other device, allowing the heat radiation to be enhanced. In this frame 50, a plurality of sets of the first lead 1 and the second leads 21, 22 are arrayed in two rows along two bars extending in the leftward-and-rightward direction. The two bars 51 (only one of them is shown in FIG. 6) are connected to each other with unshown connecting bars. Also, the mounting portions 1a of neighboring first leads 1 are connected to each other via the tie bar 52.

ii) Next, the punched frame 50 is partly bent (bending step). Modes of the bending will be described later.

iii) Next, the punched frame 50 is metal plated so that its topmost surface is formed of Au (gold) (plating step). As a result, it becomes possible to improve the solderability in soldering of outer lead portions after the completion.

iv) Next, a resin portion 3 is formed in the bent frame 50 by resin molding with a metal mold (resin molding step).

v) Next, the semiconductor laser element 5 is mounted on the mounting portion 1a of the first lead 1 via the submount member 4 (die bonding step).

vi) Next, a wire 13 made of Au wire is routed from the semiconductor laser element 5 to the protrusive portion 1e positioned rearward of the mounting portion 1a of the first lead 1, and wires 11, 12 made of Au wire are routed from the submount member 4 to the inner end portions 21a, 22a of the second leads 21, 22 (wire bonding step).

vii) Next, both the bars 51 and the connecting portions between the tie bar 52 and the lead portion 1b as well as the second leads 21, 22 are cut so that individual semiconductor laser devices are obtained (tie bar cutting step). In this operation, the lead portion 1b of the first lead 1 and part (outer lead portions) of the second leads 21, 22 are left as protruded from the resin portion 3 of each semiconductor laser device. In this case, the cutting of each tie bar 52 is done in such a manner that a mounting portion 1a—side part of the tie bar 52 is left in such a manner that it is protruded from the resin portion 3 of the semiconductor laser device and moreover inhibited from protruding from the lateral reference surface for the semiconductor laser element 5.

In this way, the semiconductor laser device is easily manufactured. Provided in the lead portion 1b of the first lead 1 is an anti-disengaging portion that is bent by the bending step, and similarly provided in the second leads 21, 22 are anti-disengaging portions that are bent by the bending step. The anti-disengaging portions of the second leads 21, 22 are bent in a different direction and at a different angle, compared with the lead portion 1b of the first lead 1. Also, the first lead 1 and the second leads 21, 22 run through and beyond the resin portion 3, and the part of the first lead 1 extending through the resin portion 3 is bent in the up/down direction, while the parts of the second leads 21, 22 extending through the resin portion 3 are bent in the left-and-right direction.

Accordingly, in the stage that the semiconductor laser device is mounted on an optical pickup device as an example, even if the material of the resin portion 3 is softened by heat of the solder in the soldering of the second leads 21, 22, the second leads 21, 22 are prevented from being moved relative to the resin portion 3 by virtue of the anti-disengaging portions. Thus, a stable soldering can be achieved, leading to a high productivity.

Also, the cut-and-raised portions 1h, 1i are provided in regions of the mounting portion 1a of the first lead 1 other than the region where the semiconductor laser element 5 is mounted, and at positions leftward and rightward of the semiconductor laser element 5 in this embodiment. After the resin molding step of above (iv), spaces ranging from the top surface side of the mounting portion 1a to vicinities of the cut-and-raised portions 1h, 1i are filled with the material of the resin portion 3. Accordingly, the mounting portion 1a (more precisely, cut-and-raised portions 1h, 1i) is sandwiched by portions of the resin portion 3. Thus, the bonding strength between the mounting portion 1a and the resin portion 3 is enhanced, so that the resin portion 3 can be prevented from peeling from the mounting portion 1a.

In addition, if the material of the resin portion 3 is set so as to just fill the spaces formed in the mounting portion 1a by the formation of the cut-and-raised portions 1h, 1i, then the bottom surface of the semiconductor laser device can be made flat. In such a case, at the stage that this semiconductor laser device is mounted on an optical pickup device as an example, the mounting portion 1a (bottom surface 1c) of the first lead 1 as well as the tie bar portions 6a, 6b can be brought into close contact with the housing of the optical pickup device. Thus, the heat radiation characteristics will not be impaired.

The outer side faces of the tie bar portions 6a, 6b, although set coplanar with the lateral reference surface of the first lead 1 in this embodiment, yet may also be positioned laterally insider of the respective lateral reference surfaces.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

REFERENCE SIGNS LIST

1 . . . first lead,
1a . . . mounting portion,
1b . . . lead portion
1c . . . bottom surface
1d, 1g . . . side face
1e . . . protrusive portion
1f . . . protrusive portion
1h, 1i . . . cut-and-raised portions
3 . . . resin portion
3a . . . lower surface
3b . . . frame portion
3c, 3d . . . tapered portions
4 . . . submount member
5 . . . semiconductor laser element
6a, 6b . . . tie bar portions
7a, 7b . . . recess portion
8 . . . window portion
11, 12, 13 . . . wires

The invention claimed is:

1. A semiconductor laser device comprising:
a semiconductor laser element;
a first lead having a mounting portion for mounting the semiconductor laser element on a top surface of the mounting portion via a submount member, and a lead portion extending from the mounting portion;
a second lead extending along the lead portion of the first lead; and
a holding portion made of an insulative material for integrally holding the first lead and the second lead, wherein
given that a direction in which a primary beam is emitted from the semiconductor laser element is defined as a forward direction, a direction vertical to the forward direction and parallel to the top surface of the mounting portion is defined as a lateral direction, and that a direction vertical to the top surface of the mounting portion is defined as an up/down direction,
the first lead has, in one region of a side face of the mounting portion, a lateral reference surface which is parallel to a side face of the semiconductor laser element and which is flat, and in the one region of the side face of the mounting portion, a recess portion is provided adjacent to the lateral reference surface, and wherein
a cut-and-raised portion is formed by cutting and upwardly raising a region of the mounting portion other than a region where the semiconductor laser element is mounted, and
spaces formed in the mounting portion by the formation of the cut-and-raised portion are filled with the material of the holding portion; the mounting portion has a part of a protrusive shape at its rear side, an upper surface of the semiconductor laser element and the part having the protrusive shape are connected to each other with a wire.

2. The semiconductor laser device as claimed in claim 1, wherein
a bottom surface of the mounting portion is exposed from the holding portion and has an up/down reference surface which is parallel to a bottom surface of the semiconductor laser element and which is flat, and
given that a direction running from the semiconductor laser element toward the mounting portion is defined as a downward direction, a lower surface of the holding portion and the up/down reference surface are coplanar with each other.

3. The semiconductor laser device as claimed in claim 2, wherein
a lower surface of the semiconductor laser device consists of the lower surface of the holding portion and the up/down reference surface of the first lead, and
the lower surface of the holding portion is positioned rearward of the up/down reference surface.

4. The semiconductor laser device as claimed in claim 1, wherein
the top surface of the mounting portion of the first lead, a bottom surface of the lead portion of the first lead, and a bottom surface of the second lead are coplanar with one another.

5. The semiconductor laser device as claimed in claim 1, wherein
the mounting portion of the first lead, the lead portion of the first lead, and the second lead are equal in up/down direction thickness to one another.

6. The semiconductor laser device as claimed in claim 1, wherein
the holding portion has a frame portion around the semiconductor laser element,
a window portion for emitting a primary beam from the semiconductor laser element is formed in the frame portion, and
given that an inside of the frame portion of the holding portion is defined as a side on which the semiconductor laser element is mounted on the mounting portion via the submount member, a tapered portion having a surface inclined with respect to the top surface of the mounting portion is provided in a location in the inside of the frame portion of the holding portion.

7. The semiconductor laser device as claimed in claim 6, wherein
the tapered portion is located rearward of the semiconductor laser element.

8. The semiconductor laser device as claimed in claim 6, wherein
an upper surface of the submount member and a top surface of the second lead positioned inside of the frame portion of the holding portion are connected to each other with a wire.

9. The semiconductor laser device as claimed in claim 1, wherein
the first lead and the second lead extend through and beyond the holding portion,
a portion extending through the holding portion of the first lead has an up/down bent portion that is bent in an up/down direction, and
a portion extending through the holding portion of the second lead has a left/right bent portion that is bent in a left/right direction.

* * * * *